United States Patent
Chastang et al.

[11] Patent Number: 5,274,420
[45] Date of Patent: Dec. 28, 1993

[54] BEAMSPLITTER TYPE LENS ELEMENTS WITH PUPIL-PLANE STOPS FOR LITHOGRAPHIC SYSTEMS

[75] Inventors: Jean-Claude A. Chastang, Mahopac; Alan E. Rosenbluth, Yorktown Heights, both of N.Y.

[73] Assignee: International Business Machines Corporation, Armonk, N.Y.

[21] Appl. No.: 871,254

[22] Filed: Apr. 20, 1992

[51] Int. Cl.[5] .................... G03B 27/54; G03B 27/42
[52] U.S. Cl. .................. 355/67; 250/492.2; 355/53; 355/71
[58] Field of Search ............... 355/53, 67, 71; 356/400, 401, 334; 378/34; 250/492.2, 515.1

[56] References Cited

U.S. PATENT DOCUMENTS

| | | | |
|---|---|---|---|
| 3,836,257 | 9/1974 | Matsumoto | 356/111 |
| 4,251,129 | 2/1981 | Suzuki et al. | 350/91 |
| 4,300,835 | 11/1981 | Schiemann et al. | 356/334 |
| 4,367,648 | 1/1983 | Sinclair et al. | 73/620 |
| 4,668,089 | 5/1987 | Oshida et al. | 356/152 |
| 4,695,732 | 9/1987 | Ward | 250/492.2 |
| 4,703,166 | 10/1987 | Bruning | 250/201 |
| 4,728,799 | 3/1988 | Gordon et al. | 250/492.2 |
| 4,746,792 | 5/1988 | Dil | 250/231 SE |
| 4,749,278 | 6/1988 | van der Werf | 356/401 |
| 4,773,750 | 9/1988 | Bruning | 353/122 |
| 4,825,090 | 4/1989 | Grabis | 250/515.1 |
| 4,828,392 | 5/1989 | Nomura et al. | 356/401 |
| 4,871,257 | 10/1989 | Suzuki et al. | 356/400 |
| 4,947,047 | 8/1990 | Muraki | 250/492.2 |
| 4,947,413 | 8/1990 | Jewell et al. | 378/34 |
| 5,144,362 | 9/1992 | Kamon et al. | 355/53 |
| 5,208,629 | 5/1993 | Matsuo et al. | 355/53 |

*Primary Examiner*—Richard A. Wintercorn
*Attorney, Agent, or Firm*—John J. Goodwin; Robert M. Trepp

[57] ABSTRACT

An object of the present invention is to provide an optical system for lithography wherein the zero order component of the main lithographic image is unobstructed and the zero order component in the ghost image is removed. The optical system includes a beamsplitter component and a condensor lens structure for illuminating a lithographic mask from a range of directions which excludes a range of directions that are sufficiently close to the axis to add undesired background to the exposure field after multiple reflections with the lens. The optical system further includes an excimer laser and a lens system having an array of stops for intercepting multiple images of the excimer laser after they reflect from the primary wafer image or other surfaces such as the mask or lens surfaces.

The illuminating zero-order beams reflect obliquely off the wafer after contributing to the image, where they are then refocussed to the opposite side of the pupil (the primary mirror). The beam then exits the lens towards the ghost image in an oblique fashion, and it will miss the wafer expose field entirely if the angles involved are sufficiently large. This redirection of the zero-orders is accomplished in the system with a molded fused silica fly's-eye-lens. A still further element of the system for stray light control is the use of a small stop in the pupil which blocks each zero-order beam after reflection from the wafer.

5 Claims, 5 Drawing Sheets

NOTE: PUPIL ACTUALLY AT INFINITY.

WAFER IMAGE

GHOST IMAGE

WAFER IMAGE

GHOST IMAGE

BEAMSPLITTER TYPE LENS ELEMENTS WITH PUPIL-PLANE STOPS FOR LITHOGRAPHIC SYSTEMS

BACKGROUND OF THE INVENTION

1. Field of the Invention

The present invention relates to lithographic lens structures, and more particularly to a lens system with a mirror lens and beam splitter combination for lithographic applications.

2. Description of Related Art

U.S. Pat. No. 3,836,257 issued Sep. 17, 1974 to Matsumoto entitled, "METHOD FOR OPTICAL DETECTION AND/OR MEASUREMENT OF MOVEMENT OF DIFFRACTION GRATING" discloses a method for optical detection and/or measurement of movement of a diffraction grating which is characterized in that the vertical movement of the diffraction grating in respect to a standard parallel beam is detected based on variation in interference fringes produced by diffracted waves from the grating moving in the standard parallel beams.

U.S. Pat. No. 4,251,129 issued Feb. 17, 1982 to Suzki et al entitled, "PHOTOGRAPHIC DETECTING DEVICE" describes a photoelectric detecting device in which a photoelectric detecting system for scanning a surface to be inspected by a light beam and for receiving the light from the inspected surface by a photoelectric detector is partly common to an observation optical system for illuminating the inspected surface with an illuminating light and for observing the inspected surface. The device has a dichroic mirror and a polarizing beam splitter, whereby photoelectric detection is effected without loss of light and without adverse effect of the illuminating light.

U.S. Pat. No. 4,300,835 issued Nov. 17, 1981 to Schiemann et al entitled, "ATTENUATOR FOR STRAY LIGHT PRODUCED IN MONOCHROMATORS" teaches a system wherein stray light produced in a monochromator by the diffuse reflection of the incoming light beam specularly reflected from the surface of the diffraction grating is practically eliminated by interposing a black glass "absorbent-reflector" in the path of the specularly reflected beam. The small percentage of radiation that is not absorbed by the absorbing glass is reflected to an opposite blackened wall which diffuse reflects an extremely small percentage of the beam back to the absorbent-reflector where a very negligible part is returned to the grating surface and eventually to the monochromator exit slit.

U.S. Pat. No. 4,367,648 issued Jan. 11, 1983 to Sinclair et al entitled "DARK FIELD VIEWING APPARATUS" discloses a dark field viewing apparatus that comprises either a source of coherent plane wave radiation and focused coherent receiving means, or a source of focused coherent radiation and a coherent receiver of plane wave radiation, the source and receiver being axially aligned in both cases; and elimination means to eliminate any radiation which in the region of the focus would travel substantially parallel to the axis of the apparatus. The apparatus may be a transmission or a reflection scanning acoustic microscope or a halographic recording system, and the elimination means may be a small acoustically-absorbent stop.

U.S. Pat. No. 4,668,089 issued May 26, 1987 to Oshida et al entitled, "EXPOSURE APPARATUS AND METHOD OF ALIGNING EXPOSURE MASK WITH WORKPIECE" describes an exposure apparatus that comprises a light source, a mask plate having an exposure pattern area section and an alignment/reflection area section, a projection lens, a movable stage for holding a workpiece having a workpiece alignment mark, an alignment control and a driver for the movable stage. Before the exposure pattern area section is illuminated by the light source to be projected through the projection lens onto the workpiece, the workpiece is properly aligned with the mask. Alignment between the mask plate and the workpiece is performed by the effective use of the alignment/reflection area section specifically arranged and having a specific structure. The alignment/reflection area section is on that surface of the mask plate which does not face the light source and includes a reflection portion for conducting light from an other light source to the workpiece and conducting light scattered from the workpiece and passing through the projection lens to the alignment control and a mask alignment mark portion of providing, when illuminated, an image of the mask alignment mark portion to the alignment control so that is detects the positional relation between the mask alignment mark portion and the workpiece alignment mark and produces a control signal for achieving alignment between the mask plate and the workpiece.

U.S. Pat. No. 4,965,732 issued Sep. 22, 1987 to Ward entitled, "ELECTRON LITHOGRAPHY APPARATUS" discloses an electron image projector for transferring mask patterns onto a semiconductor wafer comprises a patterned photosensitive cathode mask and a target formed by the semiconductor wafer coated with an electron sensitive resist. Accelerated by a uniform electric field E and focussed by a uniform magnetic field a patterned electron beam is projected from the cathode onto the target with unity magnification. The electric field is established between the cathode and an electron permeable anode grid situated between the cathode and the target. The anode grid comprises a plurality of mutually parallel slats spaced apart by elongate electron permeable regions. The grid may be formed for example by an apertured silicon wafer or conductive sheet, or by metal wires stretched across a metal annulus.

U.S. Pat. No. 4,703,166 issued Oct. 27, 1987 to Bruning entitled, "SYSTEM FOR MAINTAINING THE OPTICAL ALIGNMENT BETWEEN STATIONARY AND MOVING EQUIPMENT IN DEEP-UV LITHOGRAPHY" disclosed a deep-UV step-and-repeat photolithography system that includes a narrow-bandwidth pulsed excimer laser illumination source and an all-fused-silica lens assembly. The system is capable of line definition at the 0.5-micrometer level. One significant feature of the system is its ability to perform wafer focus tracking by simply changing the frequency of the laser.

U.S. Pat. No. 4,728,799 issued Mar. 1, 1988 to Gordon et al entitled, "HEIGHT MEASUREMENT AND CORRECTION METHOD FOR ELECTRON BEAM LITHOGRAPHY SYSTEM" discloses an improved method of height measurement and correction for a two-stage deflection ("fly's eye" lens) electron beam accessed lithography system is provided which employs a height measuring transducer such as a capacitance gauge or an optical gauge and a two position fiducial calibration grid (LFG) set at positions LFG1 and LFG2 a known distance apart and wherein the electron beam of the electron beam lithography system is sequentially deflected to the two positions for each lenslet being corrected. Measurement signals derived at each position are processed pursuant to a unique algorithm to derive desired height correction output signals and height corrected deflection signals for control of the fine deflector of the electron beam lithography system.

U.S. Pat. No. 4,747,792 issued May 25, 1988 to Dil entitled, "OPTICAL TRANSDUCER ELEMENT AND DISPLACEMENT METER COMPRISING SUCH AN ELEMENT" describes a system wherein displacement of an object is sensed by a transducer element having light first strips and dark second strips alternating in a direction of object displacement. The first strips are formed as phase gratings having grating lines extending in the direction of displacement and having a width equal to half the grating period and a depth such that the zero-order diffraction beam is suppressed. The lines may be grooves or ribs, separated by lands which are at the same level as the second strips. A device, for measuring displacement of an object on which such an element is fixed, includes an imaging system having an aperture limited such that first and higher-order diffraction beams from the phase grating are not transmitted to a radiation-sensitive pattern detection system.

U.S. Pat. No. 4,749,278 issued Jun. 7, 1988 to van der Werf entitled, "ARRANGEMENT FOR ALIGNING A MASK AND A SUBSTRATE RELATIVE TO EACH OTHER" describes an arrangement for aligning a mask and a substrate relative to each other by means of grating marks in the mask and in the substrate. A diaphragm is arranged in the path of the alignment beam behind the mask grating and transmits only specific diffraction orders of the gratings, so that the alignment signal contains less undesired components and becomes more accurate.

U.S. Pat. No. 4,773,750 issued Sep. 27, 1988 to Bruning entitled, "DEEP-UV LITHOGRAPHY" teaches a deep-UV step-and-repeat photolithography system that includes a narrow-bandwidth pulsed excimer laser illumination source and an all-fused-silica lens assembly. The system is capable of line definition at the 0.5 micrometer level. One significant feature of the system is its ability to perform wafer focus tracking by simply changing the frequency of the laser.

U.S. Pat. No. 4,825,090 issued Apr. 25, 1989 to Grabis entitled, "SHIELDING MEMBRANE" disclosed an EMI/RFI radiation and static electricity suppression device for shielding radiation from various electronic and electrical sources. The suppression devices includes a shielding membrane having the waveguide barrier with a multiplicity of protrusions facing the radiation emitting source for minimizing reflection of electromagnetic radiation incident thereupon. A plurality of conductive layers are each separated by spacers formed of a radiation absorbing media. The conductive layers include an inner-mesh disposed adjacent to the waveguide barrier and adapted for blocking low frequency radiation. A deflection layer formed of a multiplicity of spaced apart metallic deflection pads is provided for deflecting incident radiation thereabout. An absorption funneling layer disposed behind the deflection layer includes a plurality of apertures designed to receive the deflected radiation. A reflecting plate disposed behind the absorption funneling layer works in combination with the absorption funneling layer to trap radiation and cause its ultimate absorption in an absorptive region therein. Each of the conductive layers is connected to a common electrical ground. Impinging electromagnetic radiation emanating from a device may be effectively shielded with such a construction and electrostatic field build-ups are eliminated.

U.S. Pat. No. 4,828,392 issued May 9, 1989 to Nomura et al entitled, "EXPOSURE APPARATUS" describes a reduction projection type alignment and exposure apparatus which comprises a light source, a reticle having a first grating, first lens system, a spatial filter disposed around a Fourier spectral plane of the first lens system, second lens system, a substrate having a second grating, and a plurality of photo-detectors for detecting light intensifies of a plurality of spectrums appearing on the spatial filter.

The light beam generated from the light source is applied to the reticle at which it is divided into a plurality of diffracted light beams by the first grating, and the diffracted light beams are applied through the first lens system, the spatial filter and the second lens system onto the substrate so that the diffracted light beams are re-diffracted by the second grating, and the re-diffracted light beams appear as a plurality of spectrums on the spatial filter. These spectrums are detected by photodetectors and used for alignment of the reticle and the substrate.

U.S. Pat. No. 4,871,257 issued Oct. 3, 1989 to Suzuki et al entitled, "OPTICAL APPARATUS FOR OBSERVING PATTERNED ARTICLE" discloses a detection optical apparatus for an object having an actual circuit pattern that diffracts an incident light and has an alignment pattern with an illumination device having a first aperture for controlling the beam of light, the illumination device adapted to effect a dark-field illumination to the object, and an imaging optical system for forming the image of the object. The imaging optical system has a second aperture located at a position optically conjugate with the first aperture by way of the object, the first and second apertures being not overlapped when the image of the first aperture is formed on the second aperture. The second aperture has such a light blocking area that blocks diffraction light produced when the beam of light passed through the light-transmitting area of the first aperture is incident on the actual circuit pattern. Also, an optical inspection apparatus for optically inspecting articles such as photomasks or wafers, having patterns each formed by linear pattern elements having a certain directional characteristic with respect to plural directions, is disclosed. Among the linear pattern elements, at least those extending in one direction are extracted out and observed in a dark field, and any faults of the pattern such as breaks or the like and any foreign particles adhered to the pattern are detected on the basis of a reduced amount of information as compared with the information concerning the whole pattern.

U.S. Pat. No. 4,947,047 issued Aug. 7, 1990 to Muraki entitled, "EXPOSURE SYSTEM WITH EXPOSURE CONTROLLING ACOUSTOOPTIC ELEMENT" describes an exposure system which uses a pulsed laser, such as an excimer, as the light source for exposure. For exposure control, an acoustooptic element is used. More specifically, the acoustooptic element is used to modulate the intensity of a pulsed laser beam emitted from the excimer laser, to thereby allow precise control of the exposure with respect to a wafer having a resist coating.

U.S. Pat. No. 4,947,413 issued Aug. 7, 1990 to Jewell et al entitled, "RESOLUTION - DOUBLING LITHOGRAPHY TECHNIQUE" discloses a lithograhy system which is capable of doubling the spatial frequency resolution associated with conventional systems. A spatial filter, positioned to intercept the Fraunhofer diffraction pattern of the mask being exposed, is configured to prevent certain orders of the diffraction pattern from reaching the wafer's surface. The remaining orders reaching the wafer surface will produce a cos-type interference pattern with a period half of that if the mask grating were imaged without spatial filtering. Advantageously, the spatial filtering technique of the present invention allows for a variety of different structures as well as structures of different sizes and orientations, to be included on one mask and transferred to the wafer with a single exposure cycle.

In the publication entitled, "PROJECTION ELECTRON LITHOGRAPHY USING APERTURE LENSES" by Louis N. Heynick et al, IEEE Transactions on Electron Devices, Vol. ED-22, No. 7, July 1975, p. 300, methods are presented for using two-dimensional (axially symmetric) aperture lenses of both the single- and multi-aperture (fly's eye) kind of one-dimensional (planar-symmetric) aperture lenses in image-projection systems for electron lithography. The basic electron-optical properties of such aperture lenses are derived. The ancillary film technology is discussed, including preexposure and postexposure resist processes in use and the techniques developed for fabricating electron-transmission object masks that can withstand the requisite electron bombardment during image projection. The image-projection systems developed for use in fabricating arrays of thin-film field emitters, electron-beam-addressed (memory planes, optical waveguides, and interdigital transducers (unapodized and apodized) for surface-acoustic wave devices are described and representative examples of each device produced are shown.

In UK Patent 996,634 published Jun. 30, 1965 by Coelho entitled, "APPARATUS FOR IMPROVING THE LONG RANGE OBSERVATION OF AN OBJECT". A system is described wherein there is provided an apparatus for improving the long range observation of an object such apparatus comprising a searchlight for emitting and projecting a beam of light toward said object, means cooperating with said searchlight and operable to cause the beam of light from the searchlight to be projected intermittently and a sighting device is disposed adjacent and parallel to said searchlight, such device having means operable intermittently to prevent light entering said sighting device. Advantageously, a disc having apertures therein is adapted to be rotated in front of such searchlight and sighting device to effect the intermittent projection and reception of light respectively.

SUMMARY OF THE INVENTION

An object of the present invention is to provide an optical system for lithography wherein the zero order component of the main lithographic image is unobstructed and the zero order component in the ghost image is removed.

Another object of the present invention is to provide an optical system including a beamsplitter component and a condensor lens structure for illuminating a lithographic mask from a range of directions which excludes a range of diffractions that are sufficiently close to the axis to add undesired background to the exposure field after multiple reflections with the lens.

A further object of the present invention is to provide an optical system for lithography including an excimer laser and a lens system having an array of stops for intercepting multiple images of the excimer laser after they reflect from the primary wafer image or other surfaces such as the mask or lens surfaces.

DESCRIPTION OF THE PREFERRED EMBODIMENT

Illumination at deep ultraviolet wavelengths is presently significant for use in photolithography because such short wavelengths can provide resolutions of 0.5 microns or less.

Lenses that function with laser illumination at 248 nm wavelengths and as low as 193 nm and 157 nm are required. It is difficult to achieve adequate control of chromatic aberration using totally refractive lens system at such short wavelengths. A catadioptric lens system that includes lenses that contain a focussing mirror as well as refractive lens elements is preferred for short wavelengths.

Figure 1:
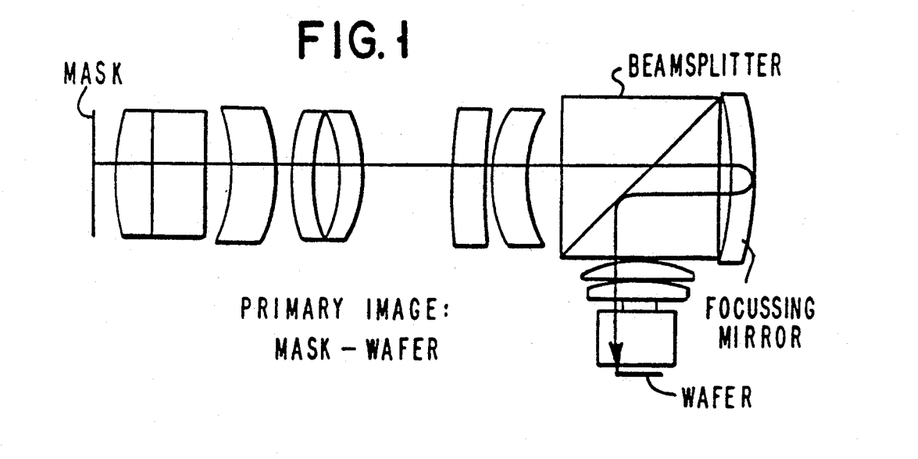
FIG. 1 is a schematic illustration of an imaging system including lenses, mask, wafer and beamsplitter wherein a nominal imaging path is shown.

However, a mirror-based lens design tends intrinsically to redirect the light back on itself. As shown in FIG. 1, in order to avoid compromising the field of view, it is advantageous to insert a beamsplitter element into the system, in order to make each field direction to 'double duty' in the image and object space.

Figure 2:
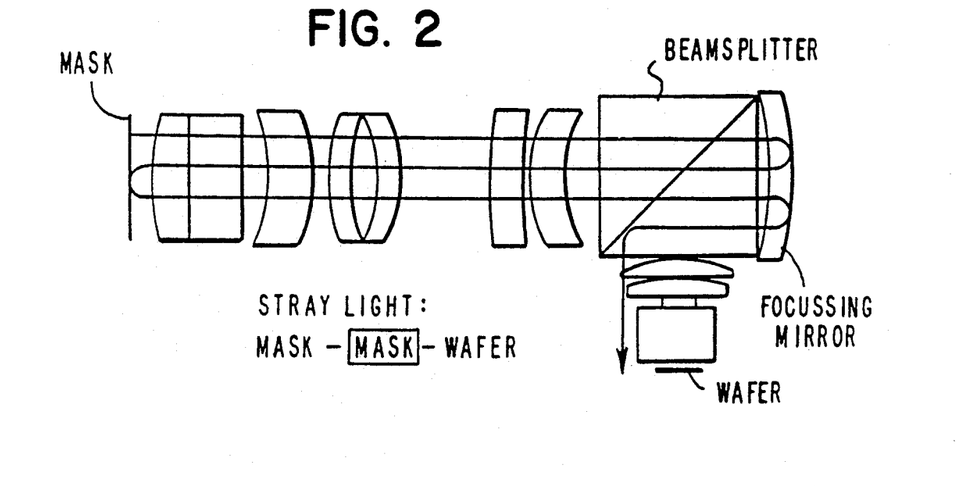
FIG. 2 is a schematic illustration of the imaging system of FIG. 1 showing a stray light path which is capable of producing undesired background on the wafer.
Figure 3:
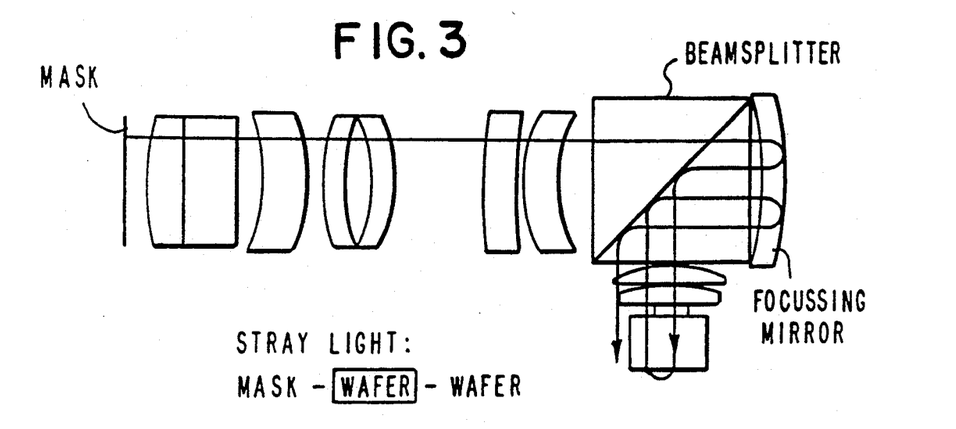
FIG. 3 is a schematic illustration of the imaging system of FIG. 1 showing another stray light path capable of producing an undesired background in the wafer.

By definition, a beamsplitter interface cannot be antireflection coated, as is done with the lens elements in conventional refractive lenses. As shown in FIGS. 2 and 3, use of a beamsplitter then implies that light can propagate through the lens in unintended paths, producing ghost images that are separated from the wafer plane. Defocussed light from these ghost images will fog the wafer. FIG. 1 shows the nominal imaging path, while FIGS. 2 and 3 show the two stray light paths which are capable of producing significant background on the wafer. It is only because mask and wafer cap the ends of the system that some of the light which is misdirected by the beamsplitter will make its way to the wafer.

In refractive lenses, it is standard practice to apply interference coatings to the lens surfaces in order to reduce the nominal 4% reflection from each surface by about an order of magnitude. If left unsuppressed, each lens surface would act as a focussing mirror, giving rise to a ghost image somewhere in space, whose defocussed light would form an undesired background on the wafer. The total from all lens surfaces and other stray light sources is typically 1% to 5% in modern refractive lithography lenses. FIGS. 2 and 3 show that the beamsplitter represents an additional source of stray light, whose contribution should be held to 1% or so.

The stray light paths shown in FIGS. 2 and 3 each involve a reflection from mask or wafer, and two extra transmissions or reflections through the beamsplitter. Worst case mask and wafer reflectivities at 248 nm would be about 40% and 50% respectively. It would be acceptable to impose a much lower limit on the mask. (10% reflectance is available commercially today at conventional wavelengths). The wafer reflectivity is often much lower as well, but a tool-based constraint on wafer reflectance would be considered an undesired imposition under present practice.

For a 50/50 beamsplitter, the above numbers suggest a stray light level of about 20%, if all the light following the paths of FIGS. 2 and 3 were to remain within the system until striking the wafer. In the discussion below, the fraction of this light actually exposing the wafer is denoted "F".

Figure 4:
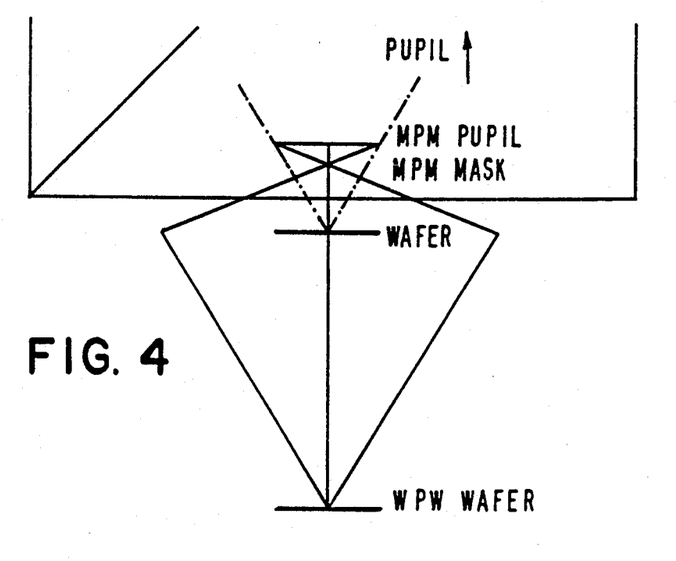
FIG. 4 is a schematic illustration of optical components and light rays showing diffracted stray light.

Lens designers usually assume that in reduction lenses the ghost images are so heavily defocussed in the plane of the wafer that nearly all the stray light would be outside the expose field, so that the resulting stray light intensity would be very low (if a field stop were used). However, because of the high intensity that is usually present in the zero order beams, this assumption is actually false unless countermeasures are taken as taught in the present invention. FIG. 4 shows that this is the case when the only misdirected light considered is that which diffracts from the mask upon illumination. The example shown in FIG. 4 is for a 30" long 5× lens (0.6 NA, 248 nm). Stray light from two different paths is shown: that following the path of FIG. 2 ("MPM"), and that following the path of FIG. 3 ("WPW"). The line labeled "wafer" is a 27 mm long slit field for a scanning configuration. (The slit is 10 mm wide in the other direction). This wafer expose field is the image of the mask through the nominal lens sequence of FIG. 1. The line labeled "MPM Mask" is the mask image as projected through the stray light path of FIG. 2. "WPW Wafer" is the image through the path of FIG. 3. The MPM and WPW images each might contain less than or equivalent to 10% of the energy in the primary image. However, their light in the plane of the wafer is defocussed into an area about 50 times larger, reducing the intensity to a negligible level. Moreover, a circuit pattern which contains a significant diffractive component must also be richly populated with resolution-limited structure, and the actual open area of the mask will be considerably less than the full area of the expose field.

Unfortunately, circuit masks always contain a substantial DC level. In clear background masks, the DC or zero order can be much stronger than any of the diffractive orders. The zero order is simply the beam from the laser source that illuminates the mask, but reduced in intensity by the amount subtracted off by diffraction from the fine structure of the mask, and by the blocking of the beam due to all opaque patterns that partially fill the field. When this beam follows the proper path through the lens, it will provide the proper DC intensity to the image when it arrives at the wafer. "Zero-order beam" will be understood in what follows to refer to this beam at any point along the proper path from the laser to the wafer. "Ghost zero order beam" will be understood to refer to such a beam after it has been directed into an improper imaging path through the lens. Light that is diffusely scattered or diffracted into such an undesired path, rather than being imaged into it, will be referred to as "diffusely scattered stray light."

Figure 5:
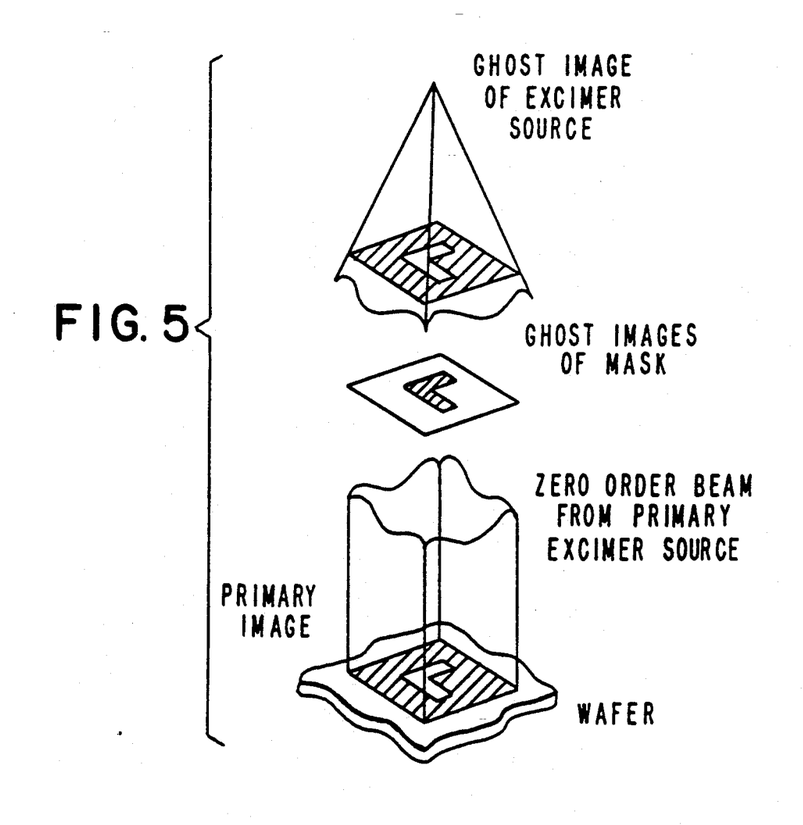
FIG. 5 is a schematic illustration of optical components and light rays showing the DC or zero order beam from a laser source illuminating a primary image of a semiconductor mask and a ghost image of the laser source illuminating a ghost image of the mask.

These points are illustrated schematically in FIG. 5. Viewing back from the wafer towards the laser source, the viewer would see the primary image of the mask formed at the plane of the wafer. The viewer would also see the primary image of the laser source itself, which as seen through the optics would appear to lie behind the mask at infinity. The primary source image would be just bright enough to contribute the proper DC intensity to the image. The viewer would also see dimmer ghost images of the mask, and also ghost images of the laser. The mask ghost images will merely act as windows for the ghost laser images, which will then directly illuminate the wafer through these windows with background light. If the mask has a large proportion of open area, as is sometimes the case (for instance, clear background patterns), the apparent transmission of these windows will be high, and the background will be significant.

This would usually be a less serious problem with stray light arising from an extra reflection off the mask versus reflection from the wafer (FIG. 2 versus 3), because clear background masks have a small proportion of reflective area from which the stray light can be returned to the system. For this reason, and because mask anti-reflection is a fairly easy choice to make, the stray light path of FIG. 3 is generally of greater concern than that of FIG. 2. Paths of "higher order" are usually not significant once those of FIGS. 2 and 3 have been brought under control.

Figure 6:
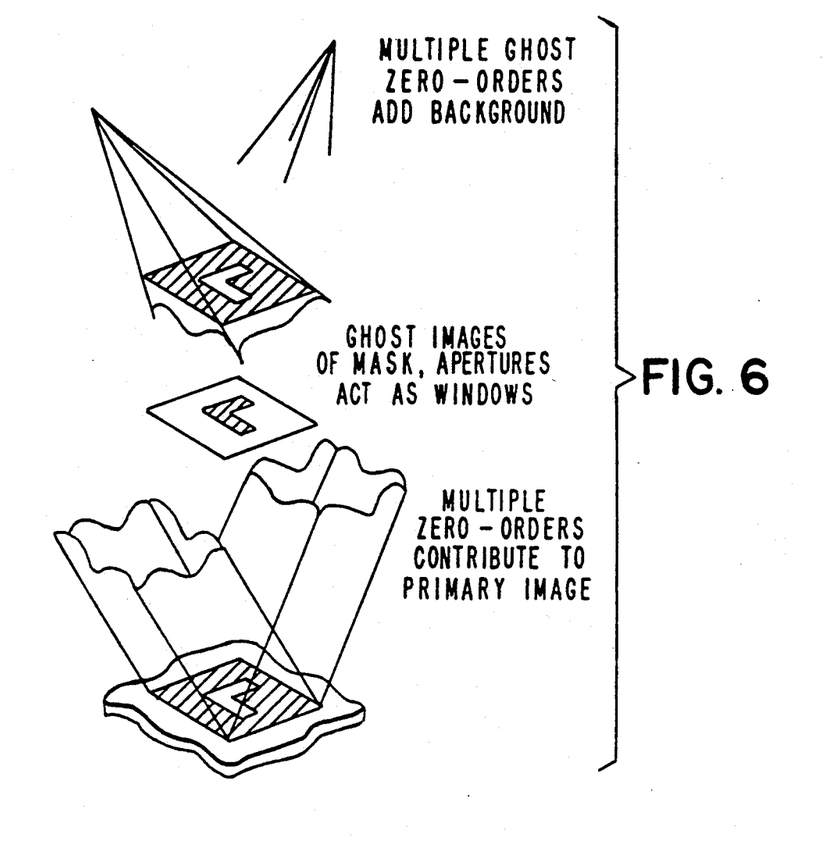
FIG. 6 is a schematic illustration of optical components and light rays showing a mask being illuminated by multiple zero order beams and the associated ghost images.

In practice, the illumination optics between the mask and laser source contains a device like a tunnel or fly's-eye lens to illuminate the mask with multiple images of the laser, instead of just a single beam. The mask must be illuminated from many different directions to eliminate "ringing" or related artifacts in the image, and more generally to achieve the proper partial coherence. Partial coherence is usually prescribed in terms of the so-called $\sigma$ factor, defined as the ratio of the sine of the angle between the most obliquely incident beam relative to the optical axis, and the numerical aperture of the projection lens. Simulations, rules of thumb, and experience are used by those skilled in the art to set the proper $\sigma$ value. This is illustrated schematically in FIG. 6 where only two of these multiple images are included for simplicity. Since the ghost images of the mask act in effect as windows which truncate the beams from the multiple ghost images of the laser, it follows that only source images sufficiently near the axis will be seen from the wafer through these windows, meaning that only some images contribute significant stray light. For the other beams, one must only contend with diffusely scattered light which standard techniques of stray light control are designed to handle.

Figure 7:
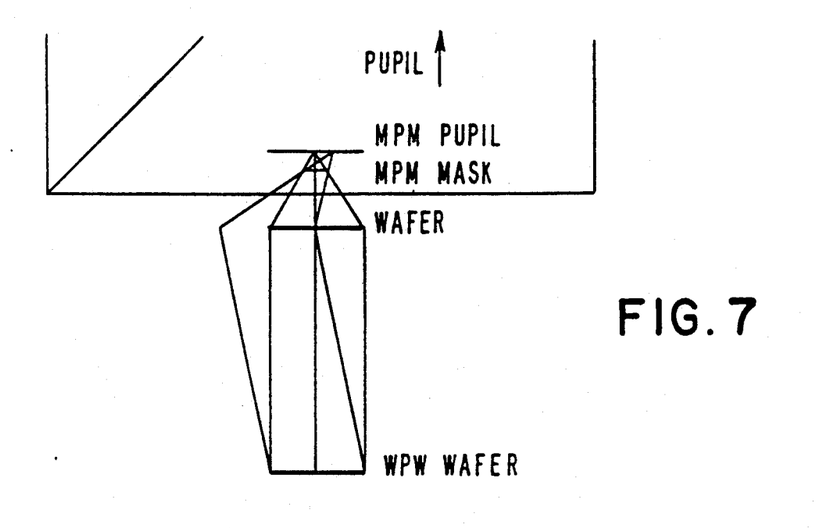
FIG. 7 is a schematic illustration of optical components and light rays similar to the configuration of FIG. 4 but showing zero-order beams instead of diffracted light.

These effects are shown approximately to scale in FIG. 7 for the same lens considered in FIG. 4 except that FIG. 7 shows the zero-order beams instead of the diffracted light. For the path of FIG. 3, these beams are collimated, so there is no increase in area between the WPW ghost image and the wafer, in contrast to the situation in FIG. 4. The MPM zero-order beams are non-collimated, but have the same cross-sectional area in the wafer plane as the WPW beams. Thus the stray light intensity is undiminished in the plane of the wafer, indicating the seriousness of zero-order ghost image beams in generating stray light.

If a typical 5×5 array of illuminating beams is used, there are wafer positions just off center at the 27 mm×10 mm field from which 6 to the 25 ghost image beams are visible (both for the MPM and WPW paths), so that the factor F defined above is 6/25.

Figure 8:
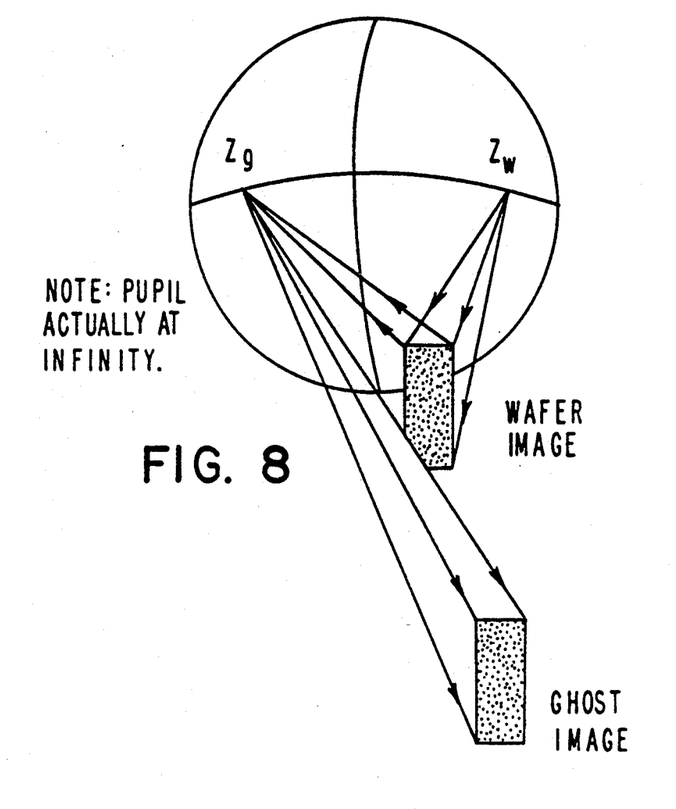
FIG. 8 is a schematic illustration of an optical system employing an illuminator wherein source points of light are displayed away from an optical axis, so that they miss the wafer image after stray reflections.
Figure 9:
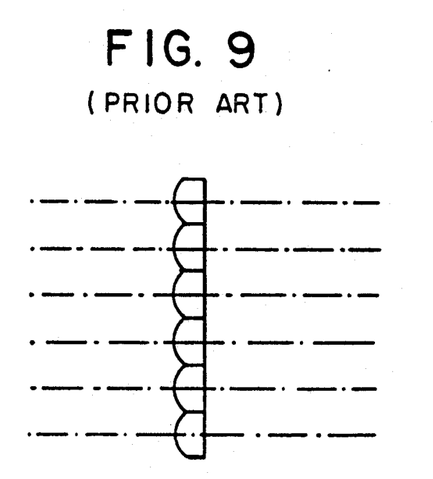
FIG. 9 is a schematic illustration of a conventional fly's-eye lens.

In the present invention, the aforesaid problem is overcome by the use of a special illuminator in which some of the source points are displaced away from the axis. The result is shown schematically in FIG. 8, where one of the illuminating zero-order beams reflects obliquely off the wafer after contributing to the image, where it is then refocussed to the opposite side of the pupil (the primary mirror). The beam then exits the lens towards the ghost image in an oblique fashion, and it will miss the wafer expose field entirely if the angles involved are sufficiently large. This redirection of the zero-orders can be accomplished with a molded fused silica fly's-eye-lens, such as shown schematically in cross section in FIG. 10. FIG. 9 shows a conventional fly's-eye-lens for purposes of comparison.

However, such an approach does not in itself always reduce the stray light to an acceptably low level, because when the mask illumination is pushed too far off axis, the quality of the primary image suffers and the image of the 0.25 μm integrated circuit pattern is degraded. The 0.25 μm pattern is only one example of integrated circuit pattern minimum width. At the extreme of acceptable non-axial illumination, the ghost images of source points each expose a separate area of the aforesaid 27 mm×10 mm field or slit in the example of FIG. 7 considered above. The area in each case is a bit smaller than one quadrant of the slit. The other ghost laser images miss the wafer field entirely; thus in this case F is 1/16th in the worst points of the field. Although this is a considerable improvement over the F=6/25 stray light level achieved with a conventional illuminator, further improvement might be desired. However, the 0.25 μm integrated circuit patterns become noticeably degraded if the mask illumination is pushed sufficiently far off-axis to reduce F to 0/25 at all points in the field.

Figure 11:
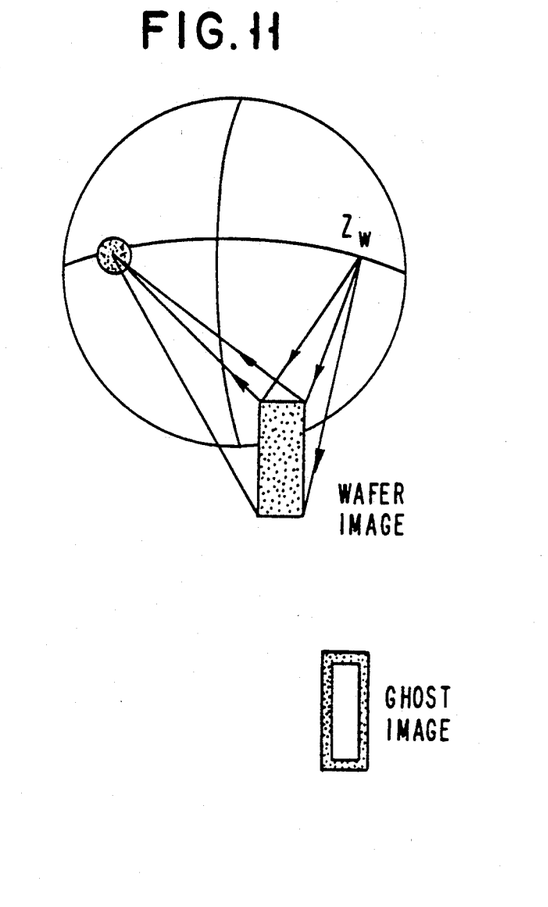
FIG. 11 is a schematic illustration of an optical system employing a small stop in the pupil for blocking zero-order beams reflected from a wafer.

A further element of the present invention for stray light control is illustrated in FIG. 11, where a small stop in the pupil blocks each zero-order beam after reflection from the wafer. (FIG. 11 should be compared with FIG. 8). The technique of FIG. 11 only works with a laser source. The WPW ghost image beams (FIG. 3) can be blocked simply by leaving uncoated small regions of the primary mirror, forming small nonreflective stops. As a result the ghost image is converted to a dim dark field image.

Depending on the location of the MPM pupil image (FIG. 2), it is also possible in some cases to insert small stops within the lens to block the zero order beams from this path as well. When such is not practical, it is natural to combine this technique with that of FIG. 10 (which works with both paths). In general, when one path ends up generating a dramatically higher background that the other, one can make small adjustments in the beam-splitting ratio to minimize the total stray light. For example, switching from a 50/50 beamsplitter to a 60/40 beamsplitter decreases the intensity of the primary image by only 1 part in 25, but changes the ratio of the MPM and WPW stray light paths by more than 2 to 1.

Figure 10:
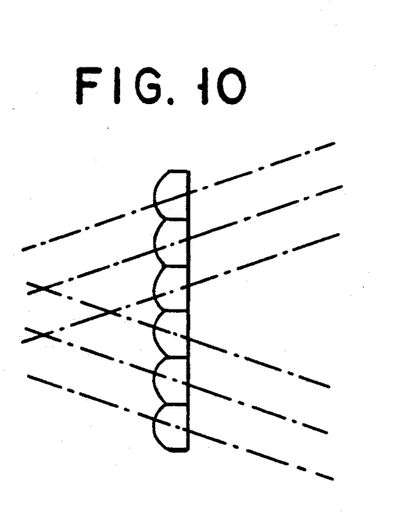
FIG. 10 is a schematic illustration of a fly's-eye lens employed in the present invention.

The results of combining fly's-eye-lens and stop of FIGS. 10 and 11 result in all 0.25 μm features being images with essentially undiminished contrast. The intensity in the resulting dark-field WPW ghost image is lower by at least 6 times than a full open field (the worse-case mask pattern without the stops). Moreover, the dark-field image is highly defocussed in the wafer plane.

Another implementation of the present invention illustrated in FIG. 9 is to displace a fly's-eye-lens and the pupil stop array by equal and opposite amounts. Because the displacements are in opposite directions, the primary zero order beams will miss the stops, and so will be able to deliver the proper DC content to the primary image.

Thus, the present invention provides a condensor system that illuminates a lithographic mask from a range of directions which, the extent consistent with acceptable illumination coherence, excludes directions sufficiently close to the axis that the associated stray light arriving at the image plane would fall within the primary expose field. An array of stops, most commonly positioned in the pupil of the lens, which intercept the multiple images of the excimer laser source after they reflect from the primary wafer image, thereby prevents radiation in these multiple images from propagating back through the system to fog the wafer.

In preferred embodiments of the invention displacement of the illuminating away from the axis is preferably obtained with a custom fly's-eye-lens, as shown in FIG. 10. In an alternative embodiment, a central portion of the direct beam from the laser is blocked before the beam enters a standard light tunnel or fly's-eye-lens.

In the common case where the stop array is located at the primary mirror, this array is most conveniently fabricated during the step when a reflective coating is applied to the polished mirror substrate, since the appropriate small regions of the mirror can then be left uncoated to form the stops. If the mirror substrate is made of a transparent material like fused silica, the radiation intercepted by the stops will then be transmitted through the mirror where it can be collected by beam dumps, or by detectors suitable for monitoring wafer reflectivity. If the mirror substrate is made of other materials like Zerodur or Pyrex, it will typically be opaque at the UV exposure wavelength. To avoid thermal deformation of the substrate it might then be necessary to form the stops with small holes in the substrate during fabrication of the blank.

If a standard illumination system is used with the stop array, it can be aligned to the array simply by displacing the fly's-eye-lens or light-tunnel (with objective) slightly off axis (without displacing the condensor lens proper). The stop array would be displaced by an equal and opposite amount relative to the optical axis. If a special fly's-eye-lens is used, the same result can be accomplished by designing into the mold from which the fused silica lenslet array is cast a suitable figuring for each lenslet.

We claim:

1. An optical system for lithography comprising a source of light beams including zero order beams and higher order beams along a central axis, a lithographic mask positioned in the path of said light beams and containing a pattern illuminated by said light beams for modifying said light beams in accordance with said patterns, a condensor lens system positioned relative to said mask in the path of said light beams, a photosensitive substrate wafer disposed to be illuminated by said patterned light beams, a beam splitter means positioned in the path of said light beams for directing said light beams onto said substrate wafer, and a fly's-eye lens array disposed in said condensor lens for displacing said zero order light beams away from said central axis.

2. An optical system for lithography according to claim 1 further including optical stops located within said lens system for blocking ghost images of said zero order light beams.

3. An optical system for lithography according to claim 2 wherein said lens system is a catadioptric lens system including a focussing mirror and refractive lens elements.

4. An optical system for lithography according to claim 1 further including ghost zero order beams which are images of said zero order light beams which reproduce said displacement of said zero order light beams by said fly's-eye lens array, and further including undesired ghost images produced by lenses or other surfaces of said system.

5. An optical system according to claim 4 wherein said zero order beams propagate to the primary image, while said ghost images reflected from said surfaces are blocked by said optical stops.

* * * * *